United States Patent
Warashina et al.

(10) Patent No.: US 8,564,036 B2
(45) Date of Patent: Oct. 22, 2013

(54) PHOTODETECTOR FOR DETECTING ENERGY LINE IN A FIRST WAVELENGTH REGION AND IN A SECOND WAVELENGTH REGION

(75) Inventors: Yoshihisa Warashina, Hamamatsu (JP); Masatoshi Ishihara, Hamamatsu (JP); Tomofumi Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 59 days.

(21) Appl. No.: 13/383,282

(22) PCT Filed: Jul. 7, 2010

(86) PCT No.: PCT/JP2010/061549
§ 371 (c)(1),
(2), (4) Date: Feb. 27, 2012

(87) PCT Pub. No.: WO2011/007703
PCT Pub. Date: Jan. 20, 2011

(65) Prior Publication Data
US 2012/0187517 A1 Jul. 26, 2012

(30) Foreign Application Priority Data
Jul. 13, 2009 (JP) ................ P2009-164766

(51) Int. Cl.
*H01L 31/0232* (2006.01)

(52) U.S. Cl.
USPC ........... 257/293; 257/292; 257/443; 257/466; 257/686

(58) Field of Classification Search
USPC ................ 257/293, 466, 686, 443, 499
See application file for complete search history.

(56) References Cited

FOREIGN PATENT DOCUMENTS

| JP | 3-18069 | 1/1991 |
|---|---|---|
| JP | 2005-277063 | 10/2005 |
| WO | 00/62344 | 10/2000 |

*Primary Examiner* — Howard Weiss
*Assistant Examiner* — Tifney Skyles
(74) *Attorney, Agent, or Firm* — Drinker Biddle & Reath LLP

(57) ABSTRACT

In a photodetector 1, a low-resistance Si substrate 3, an insulating layer 4, a high-resistance Si substrate 5, and an Si photodiode 20 construct a hermetically sealed package for an InGaAs photodiode 30 placed within a recess 6, while an electric passage part 8 of the low-resistance Si substrate 3 and a wiring film 15 achieve electric wiring for the Si photodiode 20 and InGaAs photodiode 30. While a p-type region 22 of the Si photodiode 20 is disposed in a part on the rear face 21b side of an Si substrate 21, a p-type region 32 of the InGaAs photodiode 30 is disposed in a part on the front face 31a side of an InGaAs substrate 31.

6 Claims, 8 Drawing Sheets

(a)

(b)

(a)

(b)

PHOTODETECTOR FOR DETECTING ENERGY LINE IN A FIRST WAVELENGTH REGION AND IN A SECOND WAVELENGTH REGION

TECHNICAL FIELD

The present invention relates to a photodetector for detecting an energy line in a first wavelength region and an energy line in a second wavelength region.

BACKGROUND ART

Patent Literatures 1 and 2 disclose photodetectors each having a first photosemiconductor element for detecting an energy line in a first wavelength region stacked on a second photosemiconductor element for detecting an energy line in a second wavelength region, while the first and second photosemiconductor elements have first and second photoelectric conversion units, respectively, which are arranged in a row along the optical axis.

CITATION LIST

Patent Literature

Patent Literature 1: Japanese Patent Application Laid-Open No. 3-18069
Patent Literature 2: International Publication No. 00/62344

SUMMARY OF INVENTION

Technical Problem

In the photodetector disclosed in Patent Literature 1, however, both of the first and second photosemiconductor elements are of so-called front-illuminated type, whereby the distance between the first and second photoelectric conversion units becomes longer. Therefore, when an energy line is converged, both of the first and second photoelectric conversion units cannot be placed near its converging point.

When an InGaAs photodiode or the like which requires hermetic sealing is employed as the second photosemiconductor element, on the other hand, the photodetectors disclosed in Patent Literatures 1 and 2 cannot secure hermetic sealing for the second photosemiconductor element unless the first and second photosemiconductor elements are accommodated in a hermetic package.

It is therefore an object of the present invention to provide a photodetector which makes it possible to place the first and second photoelectric conversion units close to each other and achieve hermetic sealing for the second photosemiconductor element by a simple structure.

Solution to Problem

For achieving the above-mentioned object, the photodetector in accordance with the present invention is a photodetector for detecting an energy line in a first wavelength region and an energy line in a second wavelength region on a longer wavelength side than the first wavelength region; the photodetector comprising a first semiconductor layer having a predetermined resistivity; an insulating layer laid on a main face on first side of the first semiconductor layer; a second semiconductor layer laid on a main face on the first side of the insulating layer and having a resistivity higher than the predetermined resistivity; a wiring film disposed on a main face on the first side of the second semiconductor layer while interposing an insulating film therebetween and electrically connected to an electric passage part included in the first semiconductor layer; a first photosemiconductor element disposed on a main face on second side of the first semiconductor layer so as to cover a recess formed on the main face on the second side of the first semiconductor layer and secure hermeticity within the recess and electrically connected to the electric passage part; and a second photosemiconductor element placed within the recess and electrically connected to the first photosemiconductor element; wherein the first photosemiconductor element comprises a first semiconductor substrate and a first photoelectric conversion unit, disposed on a part on the first side of the first semiconductor substrate, for generating an electric charge when the energy line in the first wavelength region is incident on the first semiconductor substrate from the second side; and wherein the second photosemiconductor element comprises a second semiconductor substrate and a second photoelectric conversion unit, disposed on a part on the second side of the second semiconductor substrate so as to oppose the first photoelectric conversion unit, for generating an electric charge when the energy line in the second wavelength region is incident on the second semiconductor substrate from the second side.

In this photodetector, the first semiconductor layer, the insulating layer, the second semiconductor layer, and the first photosemiconductor element covering the recess of the first semiconductor layer and securing hermeticity within the recess construct a hermetically sealed package for the second photosemiconductor element placed within the recess, while the electric passage part of the first semiconductor layer and the wiring film achieve electric wiring for the first and second photosemiconductor elements. While the first photoelectric conversion unit of the first photosemiconductor element is disposed on a part on the first side of the first semiconductor substrate, the second photoelectric conversion unit of the second semiconductor element is disposed on a part on the second side of the second semiconductor substrate. Therefore, by a simple structure, this photodetector can place the first and second photoelectric conversion units close to each other and achieve hermetic sealing for the second photosemiconductor element.

Here, it is preferred for the second photosemiconductor element to be electrically connected to the first photosemiconductor element by flip-chip bonding. This structure can reliably place the second photosemiconductor element closer to the first photosemiconductor element, so as to align the first and second photoelectric conversion units accurately with each other, whereby energy line coupling efficiency can be improved in both of the first and second photosemiconductor elements.

Preferably, the hermeticity within the recess is secured by hermetically bonding an electrode pad of the first photosemiconductor element to an electrode film disposed on an end face on the second side of the electric passage part. This structure can secure the hermeticity within the recess by utilizing the bond between the electrode film and the electrode pad.

Preferably, the wiring film is electrically connected to an end face on the first side of the electric passage part through a void formed in the second semiconductor layer and a void formed in the insulating layer. This structure can electrically connect the electric passage part of the first semiconductor layer and the wiring film simply and reliably.

There is a case where it is preferred for the second photosemiconductor element to be bonded to a bottom face of the recess. This structure improves the stability of the second photosemiconductor element within the recess, whereby the mechanical strength of the photodetector can be ameliorated.

There is a case where it is preferred for the second photosemiconductor element to be separated from the bottom face of the recess. This structure relieves the restriction on the thickness of the second photosemiconductor element and the dimensional accuracy of the depth of the recess therefor, whereby the photodetector can be made more easily.

Advantageous Effects of Invention

The present invention makes it possible to place the first and second photoelectric conversion units close to each other and achieve hermetic sealing for the second photosemiconductor element.

DESCRIPTION OF EMBODIMENTS

Figure 1:
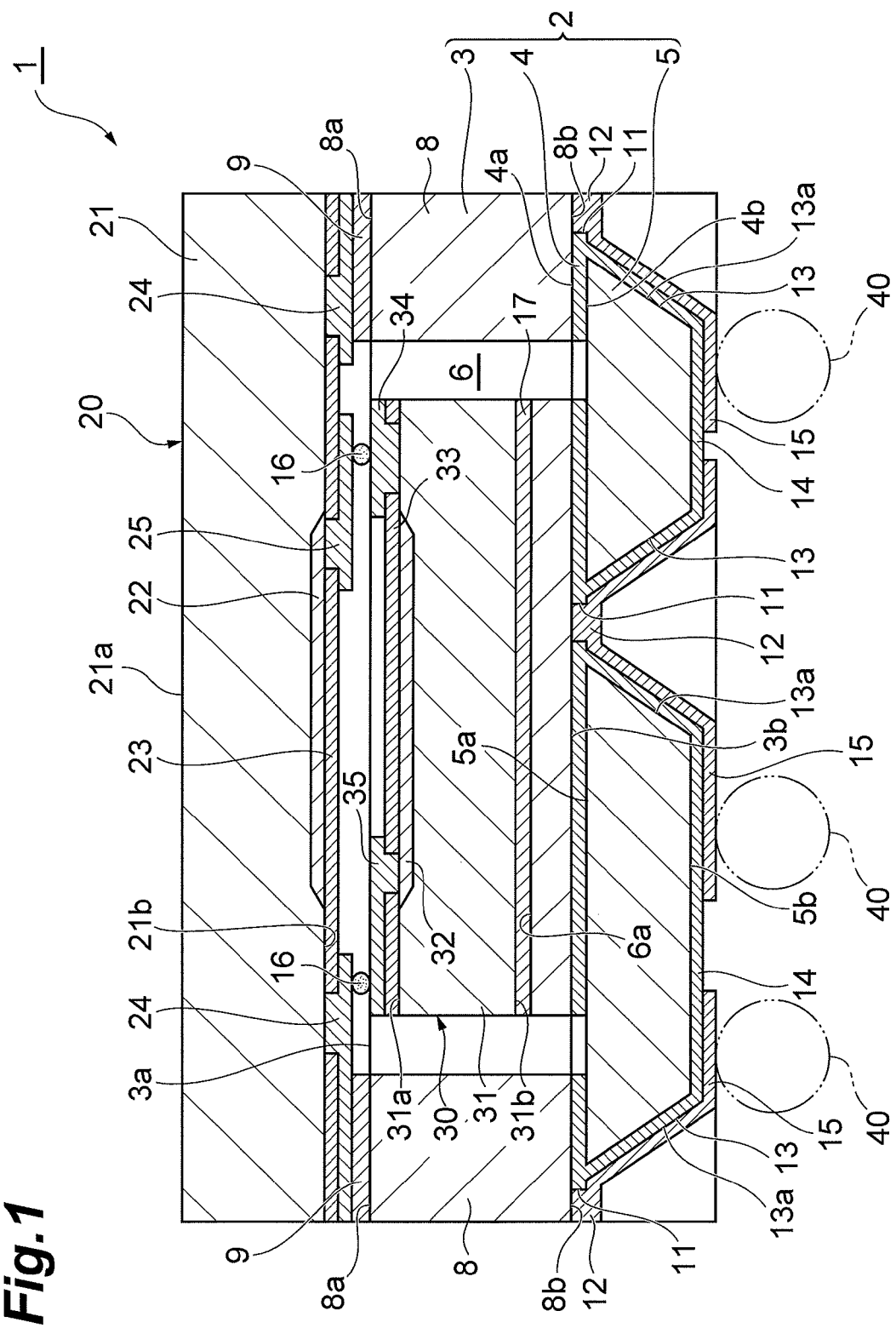
FIG. 1 is a sectional view of a first embodiment of the photodetector in accordance with the present invention.
Figure 2:
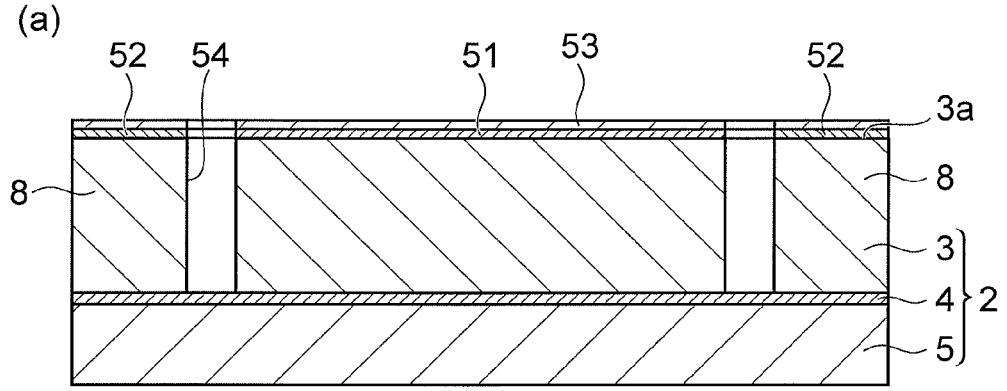
FIG. 2 is a set of sectional views for respective manufacturing steps of the photodetector of FIG. 1.
Figure 2:
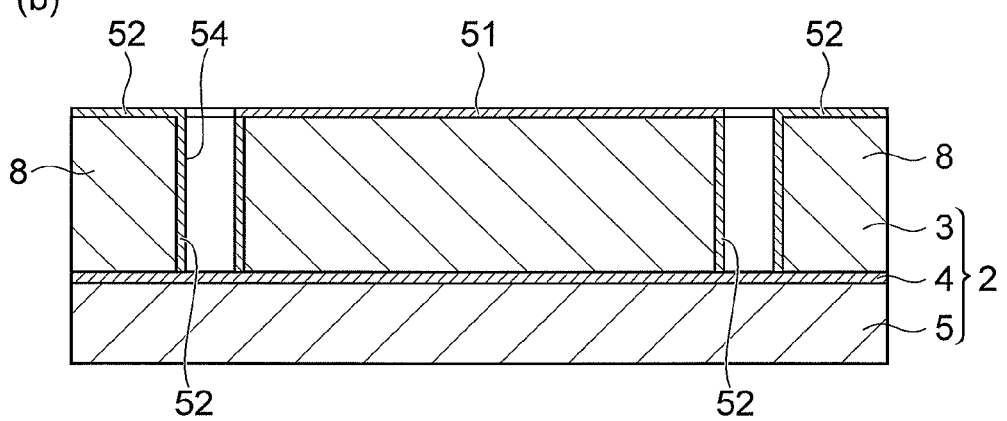
Figure 3:
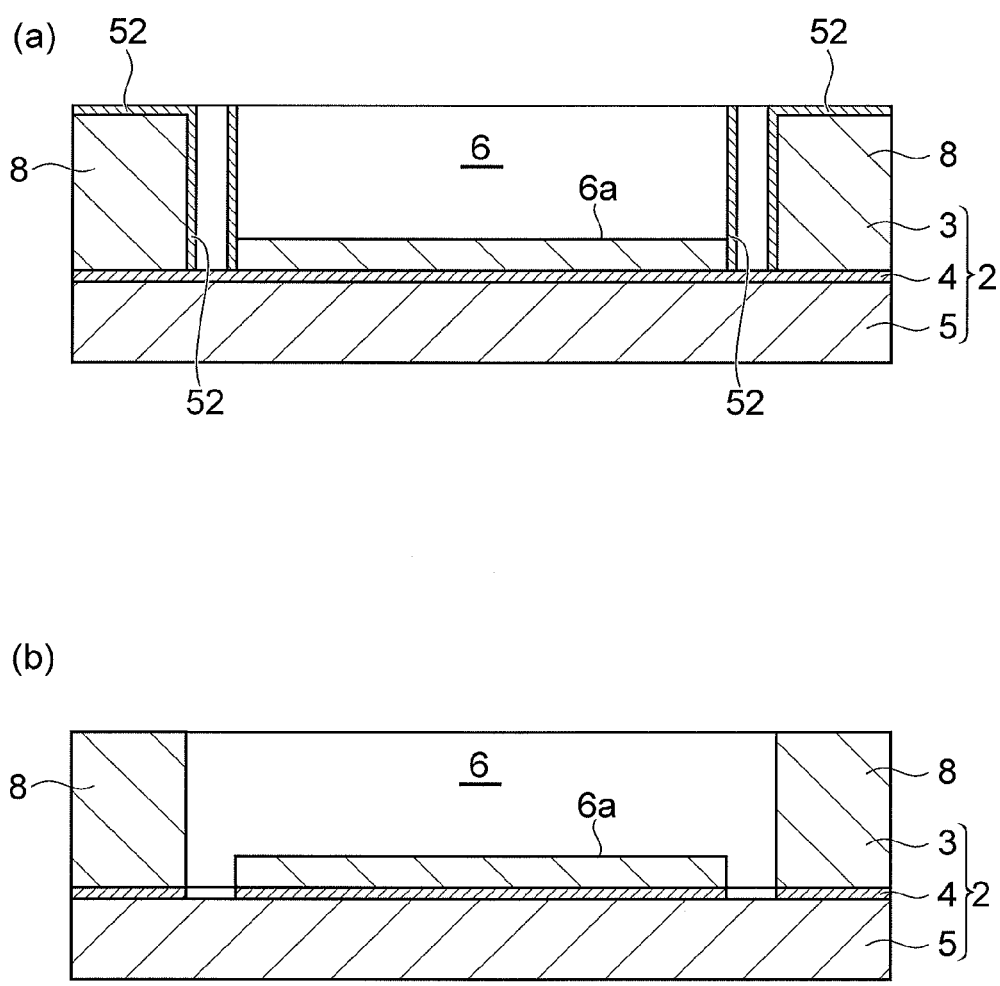
FIG. 3 is a set of sectional views for respective manufacturing steps of the photodetector of FIG. 1.
Figure 4:
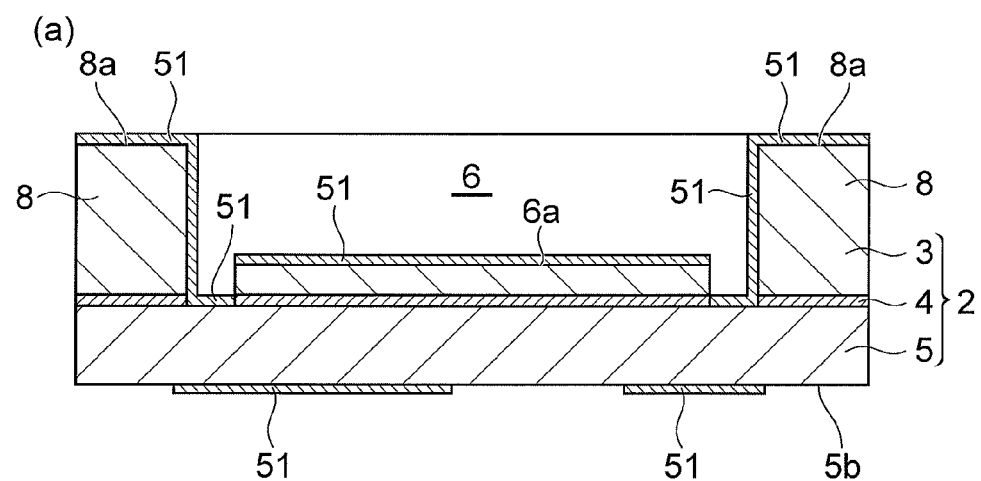
FIG. 4 is a set of sectional views for respective manufacturing steps of the photodetector of FIG. 1.
Figure 4:
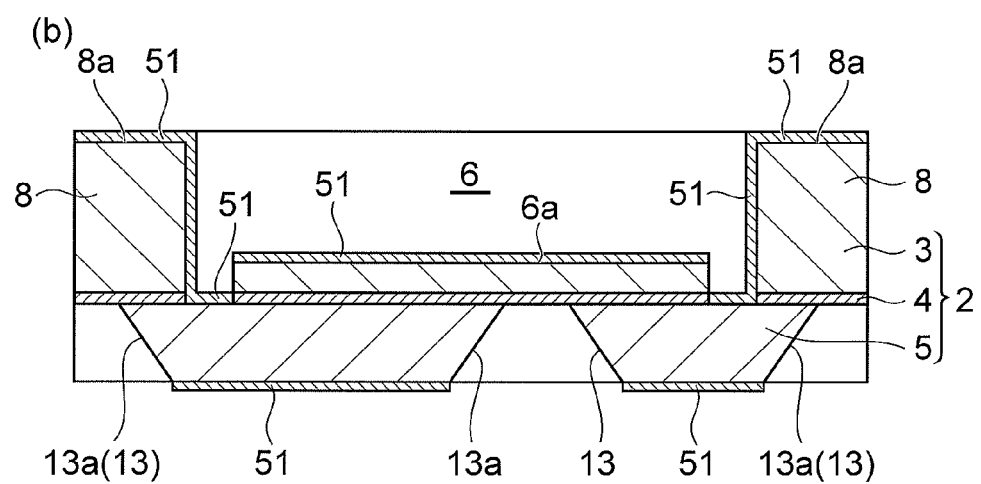
Figure 5:
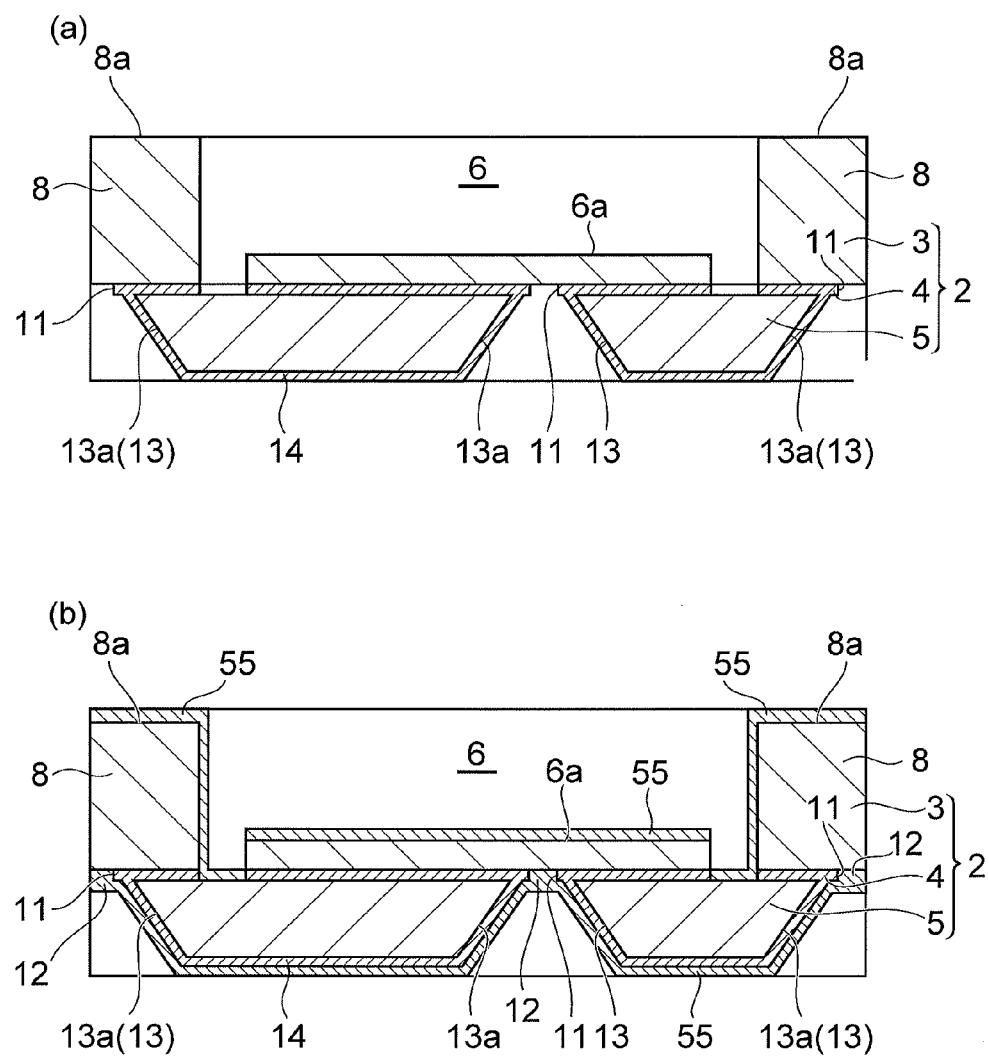
FIG. 5 is a set of sectional views for respective manufacturing steps of the photodetector of FIG. 1.
Figure 6:
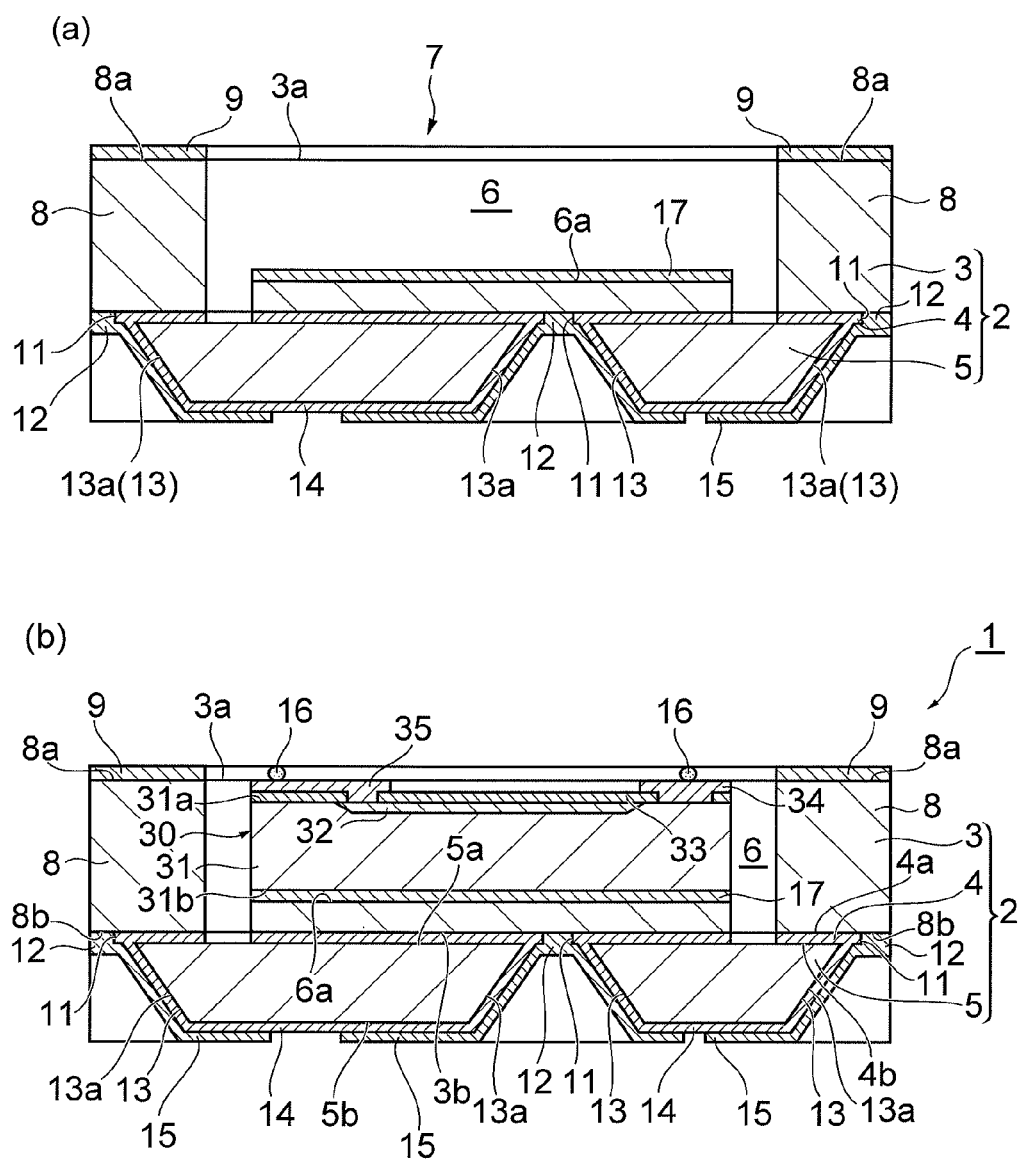
FIG. 6 is a set of sectional views for respective manufacturing steps of the photodetector of FIG. 1.

In the following, preferred embodiments of the present invention will be explained in detail with reference to the drawings. In the drawings, the same or equivalent parts will be referred to with the same signs while omitting their overlapping descriptions.

First Embodiment

FIG. 1 is a sectional view of the first embodiment of the photodetector in accordance with the present invention. As illustrated in FIG. 1, this photodetector 1 comprises an SOI (Silicon On Insulator) substrate 2 shaped like an oblong sheet. The SOI substrate 2 includes a low-resistance Si (silicon) substrate (first semiconductor layer) 3, an insulating layer 4 which is an oxide film laid on the rear face (main face on the first side) 3b of the low-resistance Si substrate 3, and a high-resistance Si substrate (second semiconductor layer) 5 laid on the rear face (main face on the first side) 4b of the insulating layer 4. The low-resistance Si substrate 3 has a predetermined resistivity (e.g., 0.01 Ω·cm), while the high-resistance Si substrate 5 has a resistivity (e.g., 1 kΩ·cm) higher than the predetermined resistivity.

The front face (main face on the second side) 3a of the low-resistance Si substrate 3 is formed with a recess 6 having an oblong cross section. An outer edge portion of the bottom face 6a of the recess 6 has such a depth as to reach at least the insulating layer 4. In the low-resistance Si substrate 3, a part surrounding the recess 6 serves as an electric passage part 8. An electrode film 9 made of Au (gold) or the like is disposed on an end face 8a on the front face side of the electric passage part 8. The electrode film 9 is formed on the end face 8a of the electric passage part 8 by resistive heating, electron beam vapor deposition, sputtering, plating, or the like, so as to come into ohmic contact with the electric passage part 8.

The insulating layer 4 is formed with voids 11 which are cutouts having a depth equal to its thickness so as to correspond to (i.e., oppose in the thickness direction) the bottom face 6a of the recess 6 and the electric passage part 8 in the low-resistance Si substrate 3. A conductive film 12 made of a metal such as Au is formed within each void 11, so as to come into ohmic contact with the electric passage part 8.

The high-resistance Si substrate 5 is formed with voids 13 which are cutouts having a depth equal to its thickness so as to correspond to (i.e., oppose in the thickness direction) the respective voids 11 of the insulating layer 4. The voids 13 have such a depth as to extend from the rear face 5b to front face 5a of the high-resistance Si substrate 5 so that its bottom face becomes the rear face 4b of the insulating layer 4. The voids 13 penetrating through the high-resistance Si substrate 5 are formed by wet etching or the like so as to become broader from the front face 5a to rear face 5b of the high-resistance Si substrate 5 (i.e., taper down from the rear face 5b to front face 5a of the high-resistance Si substrate 5).

A wiring film 15 made of a metal such as Au is disposed on the rear face 5b of the high-resistance Si substrate 5 and the inner faces 13a of the voids 13 while interposing an insulating film 14 which is an oxide or nitride film. The insulating film 14 is partly removed at end portions on the front face side of the voids 13, while the wiring film 15 is connected to the conductive film 12 at thus removed parts. As a consequence, the wiring film 15 is electrically connected to the end face 8b of the electric passage part 8 of the low-resistance Si substrate 3 through the voids 13 of the high-resistance Si substrate 5 and the voids 11 of the insulating layer 4.

The wiring film 15 disposed on the rear face 5b of the high-resistance Si substrate 5 is patterned such as to correspond to the wiring pattern of a mounting substrate (not depicted). Bonding the wiring film 15 and the wiring pattern of the mounting substrate to each other with solder bumps 40 mounts the photodetector 1 onto the mounting substrate.

An Si photodiode (first photosemiconductor element) 20 shaped like an oblong sheet is disposed on the front face 3a of the low-resistance Si substrate 3 so as to cover the recess 6 formed on the front face 3a of the low-resistance Si substrate 3 and secure the hermeticity within the recess 6. The Si photodiode 20 has an n-type Si substrate (first semiconductor substrate) 21 and a p-type region 22 disposed in a part on the rear face 21b side of the Si substrate 21. The Si photodiode 20 further comprises an insulating film 23 disposed on the rear face 21b of the Si substrate 21, an electrode pad 24 electrically connected through a contact hole of the insulating film 23 to the n-type Si substrate 21 serving as a cathode, and an electrode pad 25 electrically connected through a contact hole of the insulating film 23 to the p-type region 22 serving as an anode. The electrode pads 24, 25 are made of a metal such as Au.

In the Si photodiode 20, the p-type region 22 provided in a part on the rear face 21b side of the Si substrate 21 constitutes a first photoelectric conversion unit which generates an electric charge when an energy line in a first wavelength region (e.g., 0.32 μm to 1.1 μm) enters the Si substrate 21 from the front face 21a. Here, the n and p types in the semiconductor regions in the Si photodiode 20 are interchangeable.

The Si photodiode 20 is electrically connected to the electric passage part 8 of the low-resistance Si substrate 3. More specifically, the electrode pad 24 of the Si photodiode 20 is hermetically joined by room-temperature bonding to the electrode film 9 disposed on the end face 8a of the electric passage part 8. This secures the hermeticity within the recess 6 of the low-resistance Si substrate 3.

An InGaAs (indium gallium arsenide) photodiode (second photosemiconductor element) 30 shaped like an oblong sheet is placed within the recess 6 formed on the front face 3a of the low-resistance Si substrate 3. The InGaAs photodiode 30 has an n-type InGaAs substrate (second semiconductor substrate) 31 and a p-type region 32 formed in a part on the front face 31a side of the InGaAs substrate 31. The InGaAs photodiode 30 further comprises an insulating film 33 disposed on the front face 31a of the InGaAs substrate 31, an electrode pad 34 electrically connected through a contact hole of the insulating film 33 to the n-type InGaAs substrate 31 serving as a cathode, and an electrode pad 35 electrically connected through a contact hole of the insulating film 33 to the p-type region 32 serving as an anode. The electrode pads 34, 35 are made of a metal such as Au.

In the InGaAs photodiode 30, the p-type region 32 provided in a part on the front face 31a side of the InGaAs substrate 31 constitutes a first photoelectric conversion unit which generates an electric charge when an energy line in a second wavelength region (e.g., 1.1 µm to 1.7 µm) enters the InGaAs substrate 31 from the front face 31a. Here, the n and p types in the semiconductor regions in the InGaAs photodiode 30 are interchangeable. While the InGaAs photodiode 30 inherently has a practical sensitivity for wavelengths ranging from 0.9 µm to 1.7 µm, light having a wavelength not exceeding 1.1 µm is absorbed by the first photosemiconductor element.

The InGaAs photodiode 30 is electrically connected to the Si photodiode 20. More specifically, the electrode pad 34 of the InGaAs photodiode 30 is electrically connected to the electrode pad 25 of the Si photodiode 20 by flip-chip bonding through a solder bump 16. The electrode pad 35 of the InGaAs photodiode 30 is electrically connected to the electrode pad 24 of the Si photodiode 20 by flip-chip bonding through a solder bump 16. This makes the p-type region 22 of the Si photodiode 20 and the p-type region 32 of the InGaAs photodiode 30 align with each other, thereby opposing each other in the thickness direction. An electrode film 17 made of a metal such as Au is disposed on the bottom face 6a of the recess 6 of the low-resistance Si substrate 3, while the rear face 31b of the InGaAs substrate 31 of the InGaAs photodiode 30 is joined to the electrode film 17 by solder or a conductive resin.

In thus constructed photodetector 1, the cathode of the Si photodiode 20 and the anode of the InGaAs photodiode 30 are electrically connected to each other, so as to be drawn as a common electrode to the wiring film 15 through the electric passage part 8. The anode of the Si photodiode 20 and the cathode of the InGaAs photodiode 30 are electrically connected to each other, so as to be drawn as a common electrode to the wiring film 15 through the bottom face 6a part of the recess 6. Such wiring is employed because there is no need to take out respective signals of the photodiodes 20, 30 at the same time when aiming at broadening the sensitive wavelength region of the photodetector 1. Such wiring reduces the species of electrodes in the wiring film 15 and the like and the species of the electric passage part 8 in the low-resistance Si substrate 3, whereby the structure of the photodetector 1 can be simplified. Depending on the intended use, the cathode of the Si photodiode 20 and the cathode of the InGaAs photodiode 30 may be drawn as a common electrode to the wiring film 15, the anode of the Si photodiode 20 and the anode of the InGaAs photodiode 30 may be drawn independently from each other to the wiring film 15, or all the anodes and cathodes may be drawn independently from each other to the wiring film 15.

In the photodetector 1, as explained in the foregoing, the Si photodiode 20 covering the low-resistance Si substrate 3, the insulating layer 4, the high-resistance Si substrate 5, and the recess 6 of the low-resistance Si substrate 3 and securing the hermeticity within the recess 6 construct a hermetically sealed package for the InGaAs photodiode 30 placed within the recess 6, while the electric passage part 8 of the low-resistance Si substrate 3 and the wiring film 15 achieve electric wiring for the Si photodiode 20 and the InGaAs photodiode 30. While the p-type region 22 of the Si photodiode 20 is disposed in a part on the rear face 21b side of the Si substrate 21, the p-type region 32 of the InGaAs photodiode 30 is disposed in a part on the front face 31a side of the InGaAs substrate 31. Therefore, by a simple structure, the photodetector 1 makes it possible to place the p-type regions 22, 32 close to each other and achieve hermetic sealing for the InGaAs photodiode 30.

The InGaAs photodiode 30 is electrically connected to the Si photodiode 20 by flip-chip bonding. This can reliably place the InGaAs photodiode 30 closer to the Si photodiode 20, so as to align the p-type regions 22, 32 accurately with each other, whereby energy line coupling efficiency can be improved in both of the photodiodes 20, 30.

The electrode pad 24 of the Si photodiode 20 is hermetically joined to the electrode film 9 disposed on the end face 8a on the front face side of the electric passage part 8. Thus, the hermeticity within the recess 6 can be secured by utilizing the bond between the electrode film 9 and the electrode pad 24.

The wiring film 15 is electrically connected to the end face 8b on the rear face side of the electric passage part 8 of the low-resistance Si substrate 3 through the voids 13 formed in the high-resistance Si substrate 5 and the voids 11 formed in the insulating layer 4. This structure can electrically connect the electric passage part 8 and the wiring film 15 to each other simply and reliably.

The InGaAs photodiode 30 is joined to the bottom face 6a of the recess 6. This improves the stability of the InGaAs photodiode 30 within the recess 6, whereby the mechanical strength of the photodetector 1 can be ameliorated.

A method of manufacturing the photodetector 1 will now be explained with reference to FIGS. 2 to 7.

First, as illustrated in FIG. 2(a), an SOI substrate 2 is prepared. Subsequently, an SiN (silicon nitride) film 51 is formed in a part corresponding to the bottom face 6a of the recess 6 on the front face 3a of the low-resistance Si substrate 3, and an oxide film 52 is formed in a part corresponding to the electric passage part 8 on the front face 3a of the low-resistance Si substrate 3. Further, a resist mask 53 is formed on the SiN film 51 and oxide film 52, and then a ring-shaped groove 54 is formed by DRIE (Deep Reactive Ion Etching) in the low-resistance Si substrate 3, so as to define the electric passage part 8.

Next, as illustrated in FIG. 2(b), the resist mask 53 is removed, and the oxide film 52 is formed on a side wall of the ring-shaped groove 54 by thermal oxidation. Subsequently, as illustrated in FIG. 3(a), the SiN film 51 is removed by hot phosphoric acid, and then the recess 6 is formed by DRIB in the low-resistance Si substrate 3. Further, as illustrated in FIG. 3(b), the oxide film 52 is removed by hydrogen fluoride. At this time, the part corresponding to the outer edge portion of the bottom face 6a of the recess 6 is also removed in the insulating layer 4 made of an oxide film.

Thereafter, as illustrated in FIG. 4(a), the SiN film 51 is formed by CVD on the end face 8a of the electric passage part 8, the bottom face 6a of the recess 6, the rear face 5b of the high-resistance Si substrate 5, and the like, and the part corresponding to the voids 13 of the high-resistance Si substrate 5 in the SiN film 51 formed on the rear face 5b of the high-resistance Si substrate 5 is removed. Then, as illustrated in FIG. 4(b), the voids 13 are formed by alkali wet etching in the high-resistance Si substrate 5.

Next, as illustrated in FIG. 5(a), the SiN film 51 is removed, and then the insulating film 14 made of an oxide film is formed by CVD on the rear face 5b of the high-resistance Si substrate 5 and the inner faces 13a of the voids 13. Subsequently, a resist mask is formed by spray coating, and then the voids 11 are formed by dry etching in the insulating layer 4. Thereafter, as illustrated in FIG. 5(b), a metal film 55 is formed by vapor deposition of Au or the like on the end face 8a of the electric passage part 8, the bottom face 6a of the recess 6, the inside of the voids 11 in the insulating layer 4, the rear face 5b of the high-resistance Si substrate 5, the inner faces 13a of the voids 13, and so forth.

Subsequently, as illustrated in FIG. 6(a), a resist mask is formed by spray coating, and then the metal film 55 is patterned by wet etching, so as to form the electrode films 9, 17, conductive film 12, and wiring film 15, thereby completing a package body 7. The metal film 55 may be patterned by liftoff.

Thereafter, as illustrated in FIG. 6(b), the InGaAs photodiode 30 is placed within the recess 6 of the low-resistance Si substrate 3. At this time, the rear face 31b of the InGaAs substrate 31 is bonded by solder or a conductive resin to the electrode film 17 disposed on the bottom face 6a of the recess 6. Then, the solder bumps 16 are arranged at predetermined positions of the electrode pads 34, 35 of the InGaAs photodiode 30.

Figure 7:
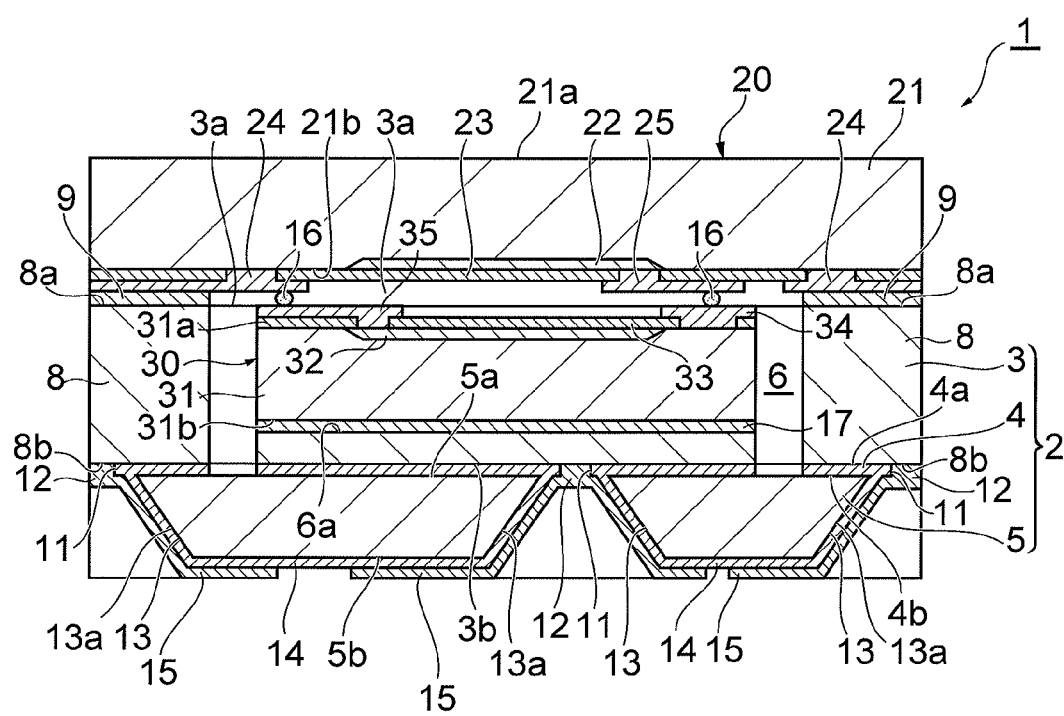
FIG. 7 is a sectional view for a manufacturing step of the photodetector of FIG. 1.

Next, as illustrated in FIG. 7, the Si photodiode 20 is placed on the front face 3a of the low-resistance Si substrate 3 so as to cover the recess 6 of the low-resistance Si substrate 3. At this time, the electrode pads 24, 25 of the Si photodiode 20 are bonded through their corresponding solder bumps 16 to the electrode pads 34, 35 of the InGaAs photodiode 30, while the electrode pad 24 of the Si photodiode 20 is joined by room-temperature bonding to the electrode film 9 disposed on the end face 8a of the electric passage part 8, so as to complete the photodetector 1. Typically, a wafer formed with a plurality of package bodies 7 and a wafer formed with a plurality of Si photodiodes 20 are joined to each other by wafer direct bonding and then separated into individual photodetectors 1 by dicing.

Second Embodiment

Figure 8:
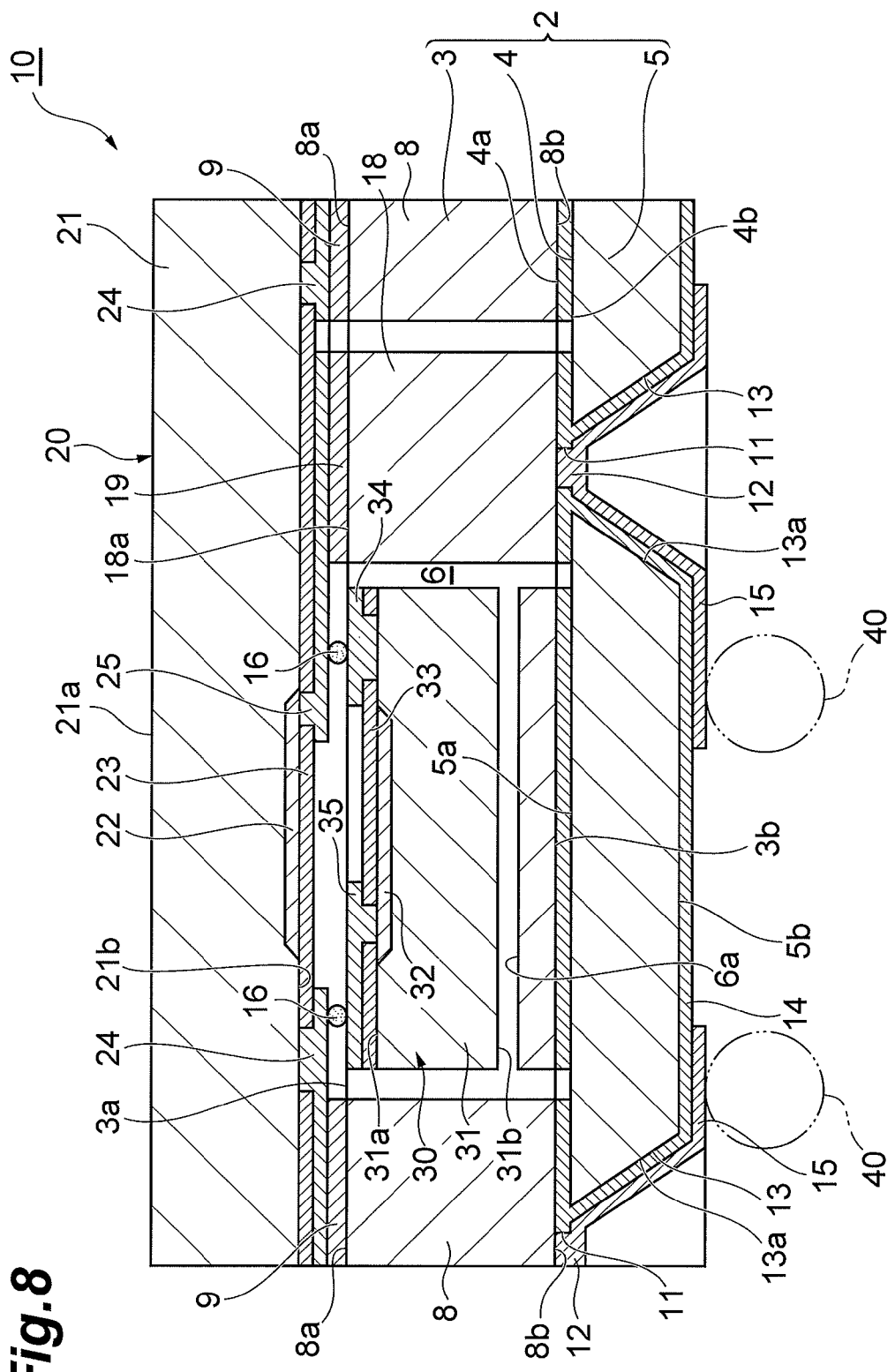
FIG. 8 is a sectional view of a second embodiment of the photodetector in accordance with the present invention.

FIG. 8 is a sectional view of the second embodiment of the photodetector in accordance with the present invention. As illustrated in FIG. 8, this photodetector 10 differs from the above-mentioned photodetector 1 mainly in that the rear face 31b of the InGaAs substrate 31 of the InGaAs photodiode 30 is separated from the bottom face 6a of the recess 6 of the low-resistance Si substrate 3. In the following, the photodetector 10 will be explained mainly in terms of differences from the above-mentioned photodetector 1.

In the photodetector 10, the low-resistance Si substrate 3 includes an electric passage part 18 electrically separated from the electric passage part 8 by a groove. An electrode film 19 made of a metal such as Au is disposed on an end face 18a on the front face side of the electric passage part 18.

The Si photodiode 20 is electrically connected to the electric passage parts 8, 18 of the low-resistance Si substrate 3. More specifically, the electrode pad 24 of the Si photodiode 20 is hermetically joined by room-temperature bonding to the electrode film 9 disposed on the end face 8a of the electric passage part 8. The electrode pad 25 of the Si photodiode 20 is hermetically joined by room-temperature bonding to the electrode film 19 disposed on the end face 18a of the electric passage part 18.

The InGaAs photodiode 30 is electrically connected to the Si photodiode 20. More specifically, the electrode pad 34 of the InGaAs photodiode 30 is electrically connected by flip-chip bonding through its corresponding solder bump 16 to the electrode pad 25 of the Si photodiode 20. The electrode pad 35 of the InGaAs photodiode 30 is electrically connected by flip-chip bonding through its corresponding solder bump 16 to the electrode pad 24 of the Si photodiode 20.

In thus constructed photodetector 10, the cathode of the Si photodiode 20 and the anode of the InGaAs photodiode 30 are electrically connected to each other, so as to be drawn as a common electrode to the wiring film 15 through the electric passage part 8. On the other hand, the anode of the Si photodiode 20 and the cathode of the InGaAs photodiode 30 are electrically connected to each other, so as to be drawn as a common electrode to the wiring film 15 through the electric passage part 18.

In the photodetector 10, as explained in the foregoing, the rear face 31b of the InGaAs substrate 31 in the InGaAs photodiode 30 is separated from the bottom face 6a of the recess 6 in the low-resistance Si substrate 3. This relieves the restriction on the thickness of the InGaAs photodiode 30 and the dimensional accuracy of the depth of the recess 6 therefor, whereby the photodetector 10 can be made more easily.

The photodetector 10 is manufactured by joining the InGaAs photodiode 30 to the Si photodiode 20 by flip-chip bonding and then, while accommodating the InGaAs photodiode 30 into the recess 6 of the low-resistance Si substrate 3, bonding the Si photodiode 20 to the electric passage parts 8, 18 of the low-resistance Si substrate 3.

The present invention is not limited to the above-mentioned embodiments. For example, the laying of the insulating layer 4 on the rear face 3b of the low-resistance Si substrate 3, the high-resistance Si substrate 5 on the rear face 4b of the insulating layer 4, and the like may not be performed directly but indirectly through some layers.

INDUSTRIAL APPLICABILITY

The present invention makes it possible to place the first and second photoelectric conversion units close to each other and achieve hermetic sealing for the second photosemiconductor element.

REFERENCE SIGNS LIST 1, 10 . . . photodetector; 3 . . . low-resistance Si substrate (first semiconductor layer); 3a . . . front face (main face on the second side); 3b . . . rear face (main face on the first side); 4 . . . insulating layer; 4b . . . rear face (main face on the first side); 5 . . . high-resistance Si substrate (second semiconductor layer); 5b . . . rear face (main face on the first side); 6 . . . recess; 6a . . . bottom face; 8, 18 . . . electric passage part; 8a, 18a . . . end face (end face on the second side); 9, 19 . . . electrode film; 11, 13 . . . void; 14 . . . insulating film; 15 . . . wiring film; 20 . . . Si photodiode (first photosemiconductor element); 21 . . . Si substrate (first semiconductor substrate); 22 . . . p-type region (first photoelectric conversion unit); 24, 25 . . . electrode pad; 30 . . . InGaAs photodiode (second photosemiconductor element); 31 . . . InGaAs substrate (second semiconductor substrate); 32 . . . p-type region (second photoelectric conversion unit)

The invention claimed is:

1. A photodetector for detecting an energy line in a first wavelength region and an energy line in a second wavelength region on a longer wavelength side than the first wavelength region, the photodetector comprising:
    a first semiconductor layer having a predetermined resistivity;
    an insulating layer laid on a main face on first side of the first semiconductor layer;
    a second semiconductor layer laid on a main face on the first side of the insulating layer and having a resistivity higher than the predetermined resistivity;
    a wiring film disposed on a main face on the first side of the second semiconductor layer while interposing an insulating film therebetween and electrically connected to an electric passage part included in the first semiconductor layer;
    a first photosemiconductor element disposed on a main face on second side of the first semiconductor layer so as to cover a recess formed on the main face on the second side of the first semiconductor layer and secure hermeticity within the recess and electrically connected to the electric passage part; and
    a second photosemiconductor element placed within the recess and electrically connected to the first photosemiconductor element;
    wherein the first photosemiconductor element comprises:
    a first semiconductor substrate and
    a first photoelectric conversion unit disposed on a part on the first side of the first semiconductor substrate, for generating an electric charge when the energy line in the first wavelength region is incident on the first semiconductor substrate from the second side; and
    wherein the second photosemiconductor element comprises:
    a second semiconductor substrate and
    a second photoelectric conversion unit disposed on a part on the second side of the second semiconductor substrate so as to oppose the first photoelectric conversion unit, for generating an electric charge when the energy line in the second wavelength region is incident on the second semiconductor substrate from the second side.

2. The photodetector according to claim 1, wherein the second photosemiconductor element is electrically connected to the first photosemiconductor element by flip-chip bonding.

3. The photodetector according to claim 1, wherein the hermeticity within the recess is secured by hermetically bonding an electrode pad of the first photosemiconductor element to an electrode film disposed on an end face on the second side of the electric passage part.

4. The photodetector according to claim 1, wherein the wiring film is electrically connected to an end face on the first side of the electric passage part through a void formed in the second semiconductor layer and a void formed in the insulating layer.

5. The photodetector according to claim 1, wherein the second photosemiconductor element is bonded to a bottom face of the recess.

6. The photodetector according to claim 1, wherein the second photosemiconductor element is separated from a bottom face of the recess.

* * * * *

UNITED STATES PATENT AND TRADEMARK OFFICE
CERTIFICATE OF CORRECTION

PATENT NO.        : 8,564,036 B2
APPLICATION NO.   : 13/383282
DATED             : October 22, 2013
INVENTOR(S)       : Warashina et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 104 days.

Signed and Sealed this
Fifteenth Day of September, 2015

Michelle K. Lee
*Director of the United States Patent and Trademark Office*